United States Patent
Lin

(10) Patent No.: US 12,132,018 B2
(45) Date of Patent: Oct. 29, 2024

(54) TRANSMISSION CIRCUIT, INTERFACE CIRCUIT, AND MEMORY

(71) Applicant: CHANGXIN MEMORY TECHNOLOGIES, INC., Anhui (CN)

(72) Inventor: Feng Lin, Shanghai (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 404 days.

(21) Appl. No.: 17/452,235

(22) Filed: Oct. 25, 2021

(65) Prior Publication Data

US 2022/0068854 A1 Mar. 3, 2022

Related U.S. Application Data

(63) Continuation of application No. PCT/CN2021/101365, filed on Jun. 21, 2021.

(30) Foreign Application Priority Data

Aug. 26, 2020 (CN) .......................... 202010873287.4

(51) Int. Cl.
*H01L 23/00* (2006.01)
*G11C 11/4076* (2006.01)
(Continued)

(52) U.S. Cl.
CPC .......... *H01L 24/06* (2013.01); *G11C 11/4076* (2013.01); *G11C 11/4093* (2013.01);
(Continued)

(58) Field of Classification Search
CPC .. G11C 11/4063–4099; G11C 5/06–10; H01L 2924/1436–14369;
(Continued)

(56) References Cited

U.S. PATENT DOCUMENTS 9,520,160 B2 12/2016 Yoon et al.
10,665,558 B2 5/2020 Kim et al.
(Continued)

FOREIGN PATENT DOCUMENTS

CN 107463295 A 12/2017
CN 110060970 A 7/2019
(Continued)

OTHER PUBLICATIONS

Kyung-Soo Ha, "A 7.5 GB/s/pin 8-GB LPDDR5 SDRAM With Various High-Speed and Low-Power Techniques", IEEE Journal of Solid-State Circuits, vol. 55, No. 1, Jan. 2020, the whole document, 10 pages.
(Continued)

*Primary Examiner* — Fernando L Toledo
*Assistant Examiner* — Marshall Mu-Nuo Hatfield
(74) *Attorney, Agent, or Firm* — Syncoda LLC; Feng Ma

(57) ABSTRACT

A transmission circuit includes: an upper-layer clock bonding pad configured to transmit a clock signal; M upper-layer data bonding pads configured to transmit data signals; a lower-layer clock bonding pad electrically connected with the upper-layer clock bonding pad, and an area of the lower-layer clock bonding pad is smaller than that of the upper-layer clock bonding pad; and M lower-layer data bonding pads electrically connected with the M upper-layer data bonding pads in a one-to-one correspondence, and an area of a lower-layer data bonding pad is smaller than that of an upper-layer data bonding pad. The upper-layer clock bonding pad and the upper-layer data bonding pads are located on a first layer, the lower-layer clock bonding pad and the lower-layer data bonding pads are located on a second layer.

7 Claims, 3 Drawing Sheets

(51) Int. Cl.
  *G11C 11/4093* (2006.01)
  *H01L 21/66* (2006.01)
(52) U.S. Cl.
  CPC .... *H01L 22/32* (2013.01); *H01L 2224/06051* (2013.01); *H01L 2224/06515* (2013.01); *H01L 2924/1436* (2013.01)
(58) Field of Classification Search
  CPC . H01L 22/30–34; H01L 2224/023–024; H01L 2224/05009; H01L 2224/05025; H01L 2224/05087; H01L 2224/0509; H01L 2224/0557; H01L 2224/08146; H01L 2224/08151–08268; H01L 2224/0812–08123; H01L 2224/06515–06519; H01L 2224/022–02215; H01L 2224/0391
  See application file for complete search history.

(56) References Cited

U.S. PATENT DOCUMENTS

| | | | | |
|---|---|---|---|---|
| 2005/0024977 A1* | 2/2005 | Ong | ........................ | G11C 29/48 365/232 |
| 2005/0139985 A1* | 6/2005 | Takahashi | ........... | H01L 25/0657 257/E23.146 |
| 2010/0244026 A1* | 9/2010 | Chang | ................. | H01L 23/4985 257/E23.01 |
| 2014/0301125 A1 | 10/2014 | Yoon et al. | | |
| 2015/0243634 A1* | 8/2015 | Aritome | .................. | H01L 24/06 257/774 |
| 2016/0225420 A1* | 8/2016 | Tang | ........................ | G11C 7/22 |
| 2018/0026013 A1* | 1/2018 | Yun | ........................ | H01L 24/09 257/48 |
| 2018/0254245 A1 | 9/2018 | Miura | | |
| 2019/0181109 A1* | 6/2019 | Kim | ........................ | G11C 5/063 |
| 2020/0058333 A1* | 2/2020 | Bell | .................... | G11C 11/4076 |

FOREIGN PATENT DOCUMENTS

| | | |
|---|---|---|
| CN | 111105826 A | 5/2020 |
| KR | 20090045753 A | 5/2009 |

OTHER PUBLICATIONS

First Office Action of the Korean application No. 10-2022-7021247, issued on Nov. 27, 2023, 12 pages with English translation.

* cited by examiner

TRANSMISSION CIRCUIT, INTERFACE CIRCUIT, AND MEMORY

CROSS-REFERENCE TO RELATED APPLICATIONS

This is a continuation of International Application No. PCT/CN2021/101365 filed on Jun. 21, 2021, which claims priority to Chinese Patent Application No. 202010873287.4 filed on Aug. 26, 2020. The disclosures of the above-referenced applications are hereby incorporated by reference in their entirety.

BACKGROUND

A Dynamic Random Access Memory (DRAM) is a semiconductor memory device commonly used in computers and consists of many repetitive memory units. Each memory unit generally includes a capacitor and a transistor. A gate of the transistor is connected with a word line, a drain of the transistor is connected with a bit line, a source of the transistor is connected with the capacitor, and a voltage signal on the word line may control the transistor to be turned on or off, so that data information stored in the capacitor is read through the bit line, or the data information is written into the capacitor for storage through the bit line.

SUMMARY

Embodiments of the present disclosure relate to a transmission circuit, an interface circuit and a memory.

According to an embodiment of the present disclosure, a transmission circuit is provided, which includes an upper-layer clock bonding pad, M upper-layer data bonding pads, a lower-layer clock bonding pad and M lower-layer data bonding pads. The upper-layer clock bonding pad is configured to transmit a clock signal. The M upper-layer data bonding pads are configured to transmit data signals. The lower-layer clock bonding pad is electrically connected with the upper-layer clock bonding pad, and an area of the lower-layer clock bonding pad is smaller than that of the upper-layer clock bonding pad. The M lower-layer data bonding pads are electrically connected with the M upper-layer data bonding pads in a one-to-one correspondence, and an area of a lower-layer data bonding pad is smaller than that of an upper-layer data bonding pad. The upper-layer clock bonding pad and the upper-layer data bonding pads are located on a first layer, the lower-layer clock bonding pad and the lower-layer data bonding pads are located on a second layer, a dielectric layer is arranged between the first layer and the second layer, the first layer, the dielectric layer and the second layer are all located on a same substrate, and M is an integer greater than or equal to 2.

According to an embodiment of the present disclosure, an interface circuit is further provided, which includes the transmission circuit described above and M input buffer circuits. The M input buffer circuits are in a one-to-one correspondence with the lower-layer data bonding pads, and each input buffer circuit is configured to receive a data signal transmitted by a lower-layer data bonding pad corresponding to the input buffer circuit under driving of the clock signal. The lower-layer clock bonding pad and the lower-layer data bonding pads are arranged in a first row, the M lower-layer data bonding pads are arranged on two sides of the lower-layer clock bonding pad, and half of the M lower-layer data bonding pads are arranged on each side. The M input buffer circuits are arranged in a second row and form an axis perpendicular to the first row with the lower-layer data bonding pads as references, the M input buffer circuits are arranged on two sides of the axis, and half of the M input buffer circuits are arranged on each side. A distance between each input buffer circuit and the axis is smaller than that between the lower-layer data bonding pad corresponding to the input buffer circuit and the axis.

According to an embodiment of the disclosure, a memory is further provided, which includes the interface circuit described above.

DETAILED DESCRIPTION

The DRAM may be divided into a Double Data Rate (DDR) DRAM, a Graphics Double Data Rate (GDDR) DRAM and a Low Power Double Data Rate (LPDDR) DRAM. With more and more DRAM application fields, such as the DRAM being increasingly used in the mobile field, users have higher and higher requirements on the power consumption index of the DRAM.

Various embodiments of the present disclosure can improve performance of DRAM.

In a memory, a write data sampling signal (a Dqs signal or a Wck signal) is used as a clock of write data. During a write operation, edges (a rising edge and a falling edge) of the Dqs signal or the Wck signal should be aligned in timing with a center of a data signal (a DQ signal), which may also be allowed to be substantially aligned with the center taking into account timing margins. A transmission path of the DQ signal is defined as a data path, and a length of the data path may affect the time when the edges of the DQ signal reach a device port (such as a data port of a register). A transmission path of the Dqs or Wck is defined as a clock path, and a length of the clock path may affect the time when the Dqs or Wck signal reaches the device port (such as a clock port of the register). A difference between the data path of the DQ signal and the clock path of the Dqs or Wck signal is defined as tDQS2DQ or tWCK2DQ. The smaller the tDQS2DQ or the tWCK2DQ is, the more matching the data path and the clock path is, and the better the correspondingly circuit timing is. It can be understood that the difference described above is a time interval between the edges of the Dqs or Wck signal and the center of the DQ signal. The application of Wck is the same as or similar to that of the Dqs, for example, a clock in LPDDR4 is referred to as the Dqs, and a clock in LPDDR5 is referred to as the Wck.

Figure 1:
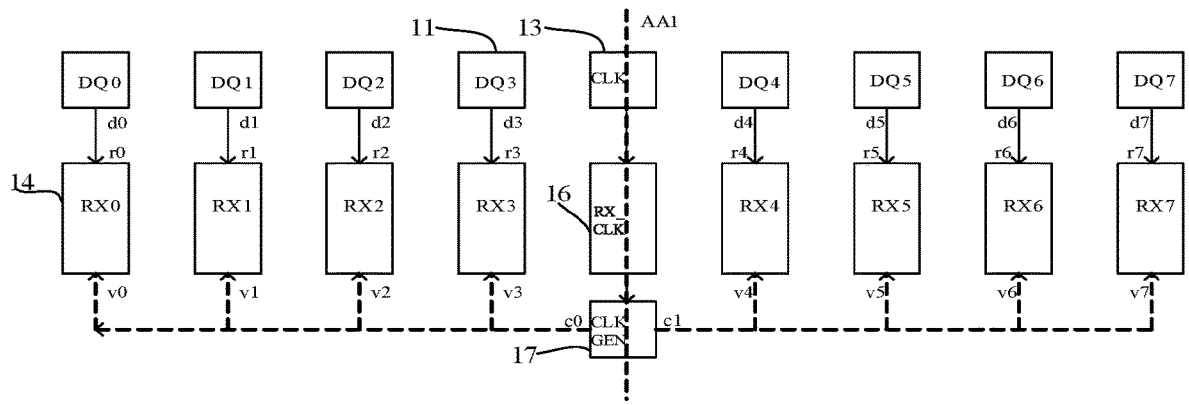
FIG. 1 is a structural schematic diagram of an interface circuit.

A specific analysis will be carried out in combination with FIG. 1. FIG. 1 is a structural schematic diagram of an interface circuit.

Referring to FIG. 1, the interface circuit includes multiple data bonding pads 11, a central axis AA1, a clock bonding pad 13, multiple input buffer circuits 14, multiple output buffer circuits (not illustrated), a clock receiver circuit 16 and a clock generating circuit 17. The multiple data bonding pads 11 are arranged side by side and configured to transmit data signals, and half of the multiple data bonding pads 11 are distributed on one side of the central axis AA1 and the other half are distributed on the other side of the central axis AA1. The clock bonding pad 13 is located at the central axis AA1. The multiple input buffer circuits 14 are corresponded to the data bonding pads 11, and a data path between each input buffer circuit 14 and a corresponding data bonding pad 11 is the same (or substantially the same within a certain error range, considering that the same path is only an ideal situation in the actual circuit design and manufacturing process, the path herein and hereafter has the same definition and includes the meaning of being substantially the same within the certain error range, and the certain error range herein may be understood but not limited to an error between different paths within 1% or 3%). The multiple output buffer circuits (not illustrated) correspond to the data bonding pads 11, and a timing path between each output buffer circuit and the corresponding data bonding pad 11 is the same. The clock receiver circuit 16 is electrically connected with the clock bonding pad 13 and configured to receive a clock signal and transmit the clock signal to the clock generating circuit 17, the clock generating circuit 17 receives the clock signal and generates a driving clock, and the input buffer circuits 14 receive the driving clock and the data signals and transmits the data signals.

In FIG. 1, the data bonding pads 11 are denoted by DQ0/DQ1 . . . DQ7. The clock bonding pad 13 is denoted by CLK, and the CLK may be shown as the Dqs or the Wck. The input buffer circuits 14 are denoted by RX0/RX1 . . . RX7, and the input buffer circuits 14 are also receiver circuits. The clock receiver circuit 16 is denoted by RX_CLK. The clock generating circuit 17 is denoted by CLK GEN.

A data path through which a data signal of the data bonding pad 11 is transmitted to the corresponding input buffer circuit 14 is a first path, and a timing path through which a clock signal of the clock bonding pad 13 is transmitted to the corresponding input buffer circuit 14 is a second path. In FIG. 1, different input buffer circuits 14 have the same first path. However, the input buffer circuit 14 further from the clock bonding pads 13 has a longer second path. Therefore, the farther the input buffer circuit 14 from the clock bonding pad 13 is, the larger gap between the first path and second path is, which results in a larger corresponding tDQS2DQ or tWCK2DQ, and the problem of timing violation becomes more serious. The tDQS2DQ or tWCK2DQ corresponding to the input buffer circuit 14 farthest from the clock bonding pad 13 may be derived from FIG. 1.

The time that the data signals of different data bonding pads 11 reach the corresponding input buffer circuits 14 is close. By taking the input buffer circuits 14 farthest from and closest to the clock bonding pad 13 in FIG. 1 as an example, the time that the clock signal reaches the input buffer circuit 14 furthest from the clock bonding pad 13 (the input buffer circuit 14 corresponding to the DQ0) is the latest, the time that the clock signal reaches the input buffer circuit 14 closest to the clock bonding pad 13 (the input buffer circuit 14 corresponding to the DQ3) is the earliest, so that the input buffer circuit 14 closest to the clock bonding pad 13 firstly receives and transmits the data signal, the input buffer circuit 14 farthest from the clock bonding pad 13 transmits the data signal latest, and a time difference between the two input buffer circuits 14 for transmitting the data signal is large. Accordingly, if a clock path and a data path of the input buffer circuit 14 corresponding to DQ3 are matched, a clock path and a data path of the input buffer circuit 14 corresponding to DQ0 are less likely to be matched.

Specifically, in combination with FIG. 1, each data bonding pad 11 has a corresponding first port d0/d1 . . . d7. Each input buffer circuit 14 has a second port r0/r1 . . . r7 connected with a first port of the corresponding data bonding pad 11, respectively. Each input buffer circuit 14 has a third port v0/v1 . . . v7 connected with the clock generating circuit 17, respectively. The clock generating circuit 17 has a fourth port c0 connected with each input buffer circuit 14 located on one side of the central axis AA1, and the clock generating circuit 17 also has a fifth port c1 connected with each input buffer circuit 14 located on the other side of the central axis AA1. For RX0, a clock path of the clock signal is c0→v0, and a data path of the data signal is d0→r0; for RX1, a clock path of the clock signal is c1→v1, and a data path of the clock signal is d1→r1; and so on. It is not difficult to find that for different input buffer circuits 14, the corresponding data paths do not change, but the input buffer circuit 14 closer to the center axis AA1 has a shorter clock path. Thus, the problem of a larger difference in tDQS2DQ or tWCK2DQ arises.

From the above analysis, tDQS2DQ or tWCK2DQ corresponding to different input buffer circuits 14 differs greatly, and there are strict requirements on the value of tDQS2DQ or tWCK2DQ in the memory, for example, requiring that the value of tDQS2DQ or tWCK2DQ not be greater than 800 ps, which otherwise causes timing violations.

In order to solve the above problem, the embodiment of the present disclosure provides a transmission circuit. An upper-layer clock bonding pad and upper-layer data bonding pads respectively connected with a lower-layer clock bonding pad and lower-layer data bonding pads are designed in an on die redistribution layer (RDL) manner; and the lower-layer clock bonding pad and the lower-layer data bonding pads are arranged in a centralized layout manner, so that each input buffer circuit connected with the lower-layer data bonding pads may also be arranged in a centralized layout manner, thereby shortening the clock path of clock signal to be transmitted to each input buffer circuit, shortening the difference value between the clock path of the clock signal and the data path of data signal. Thus, tDQS2DQ or tWCK2DQ is shortened, and the problem of timing violations is further improved. The interface circuit according to the embodiment will be described in detail below in combination with the drawings.

Figure 2:
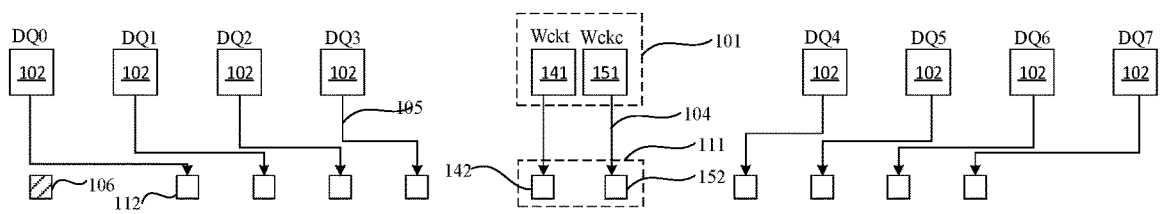
FIG. 2 is a layout schematic diagram of an equivalent circuit of a transmission circuit according to an embodiment of the present disclosure.
Figure 3:
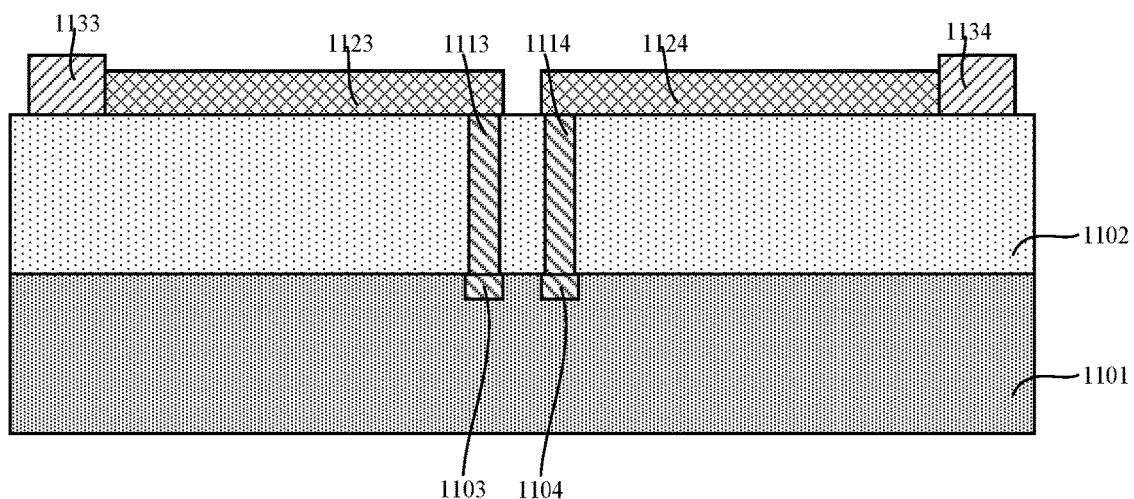
FIG. 3 is a structural schematic diagram of a cross-sectional view of an on die RDL.
Figure 4:
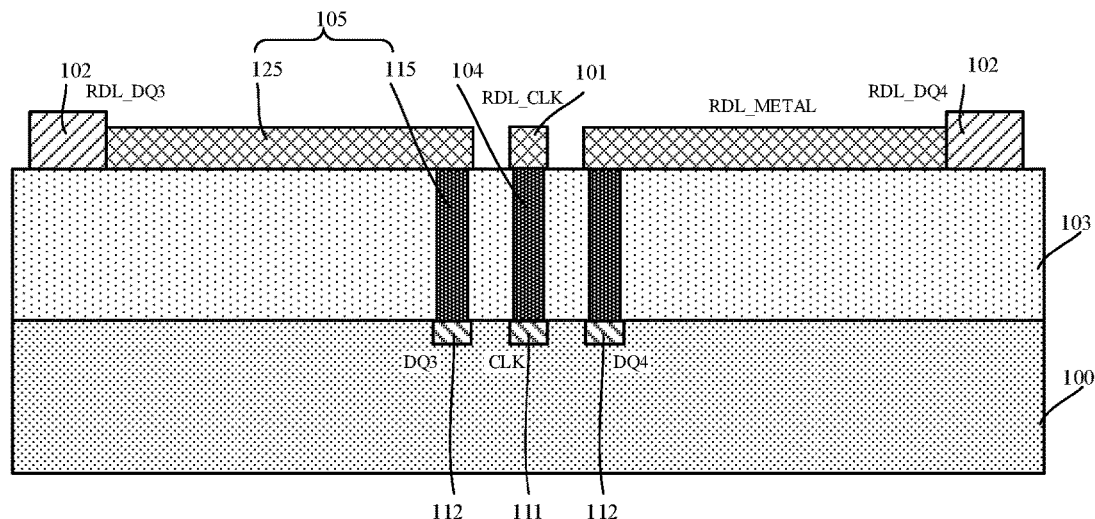
FIG. 4 is a structural schematic diagram of a partial cross-sectional view of a transmission circuit shown in FIG. 2.

FIG. 2 is a layout schematic diagram of an equivalent circuit of a transmission circuit according to an embodiment of the present disclosure. FIG. 3 is a structural schematic diagram of a cross-sectional view of an on die RDL. FIG. 4 is a structural schematic diagram of a partial cross-sectional view of a transmission circuit according to an embodiment of the present disclosure.

Referring to FIGS. 2-4, in the embodiment, the transmission circuit includes an upper-layer clock bonding pad 101, M upper-layer data bonding pads 102, a lower-layer clock bonding pad 111 and M lower-layer data bonding pads 112. The upper-layer clock bonding pad 101 is configured to transmit a clock signal. The M upper-layer data bonding pads 102 are configured to transmit data signals. The lower-layer clock bonding pad 111 is electrically connected with the upper-layer clock bonding pad 101, and an area of the lower-layer clock bonding pad 111 is smaller than that of the upper-layer clock bonding pad 101. The M lower-layer data bonding pads 112 are electrically connected with the M upper-layer data bonding pads 102 in a one-to-one correspondence, and an area of a lower-layer data bonding pad 112 is smaller than that of an upper-layer data bonding pad 102. The upper-layer clock bonding pad 101 and the upper-layer data bonding pads 102 are located on a first layer, the lower-layer clock bonding pad 111 and the lower-layer data bonding pads 112 are located on a second layer, a dielectric layer 103 is arranged between the first layer and the second layer, the first layer, the dielectric layer 103 and the second layer are all located on a same substrate 100, and M is an integer greater than or equal to 2.

The embodiment of the present disclosure provides the transmission circuit with excellent structural performance. The M upper-layer data bonding pads 102 and the upper-layer clock bonding pad 101 are located on the first layer, the M lower-layer data bonding pads 112 and the lower-layer clock bonding pad 111 are located on the second layer, the area of the lower-layer clock bonding pad 111 is smaller than that of the upper-layer clock bonding pad 101, and the area of the lower-layer data bonding pad 112 is smaller than that of the upper-layer data bonding pad 102. Therefore, compared with the position relationship between the upper-layer data bonding pad 102 and the upper-layer clock bonding pad 101, the distance between the lower-layer data bonding pad 112 and the lower-layer clock bonding pad 111 is shorter, so that the centralized processing on the lower-layer data bonding pad 112 is achieved, the centralized processing on input buffer circuits may be further achieved, a clock path for transmitting the clock signal to each input buffer circuit is shortened, a matching degree of the clock path and the data path is improved, and tDQS2DQ or tWCK2DQ and timing violation are favorably reduced. In addition, due to the reduction of the clock path, the power loss of the interface circuit is reduced.

The transmission circuit according to the embodiment will be described in detail below in combination with the drawings.

In the embodiment, the transmission circuit may be applied to the DRAM, such as LPDDR5.

The upper-layer clock bonding pad 101 and the M upper-layer data bonding pads 102 are arranged in a first row, the M upper-layer data bonding pads 102 are arranged on two sides of the upper-layer clock bonding pad 101, and half of the M upper-layer data bonding pads 102 are arranged on each side. The upper-layer data bonding pads 102 are DQ data pads and configured to transmit DQ signals, i.e., the data signals include input and output data. When M is an even number, for example, M is equal to 8, then 4 upper-layer data bonding pads 102 are arranged on each side of the axis AA1. When M is an odd number, for example, M is equal to 7, then 3 upper-layer data bonding pads 102 are arranged on one side of the axis AA1 and 4 upper-layer data bonding pads 102 are arranged on the other side. The term "half" mentioned above, when M is an even number, should be understood as M/2, and when M is an odd number, should be understood as (M−1)/2 or (M+1)/2, the following is the same.

Eight upper-layer data bonding pads 102 in FIG. 2 are taken as an example, and the upper-layer data bonding pads 102 are denoted by DQ0, DQ1, DQ2, DQ3, DQ4, DQ5, DQ6, DA7. It can be understood that, in other embodiments, the number of upper-layer data bonding pads may be reasonably set according to actual requirements of the transmission circuit.

The upper-layer clock bonding pad 101 may be configured to transmit a CLK signal, i.e. the clock signal is the Dqs or the WCK signal, which refer to a write clock signal or a read clock signal. Correspondingly, the upper-layer clock bonding pad 101 is a differential input bonding pad and includes a first upper-layer clock bonding pad 141 and a second upper-layer clock boding pad 151, and the first upper-layer clock bonding pad 141 and the second upper-layer clock bonding pad 151 respectively transmit complementary clock signals. Specifically, in FIG. 2, the first upper-layer clock bonding pad 141 is denoted by Wckt and configured to transmit a Wckt clock signal. The second upper-layer clock bonding pad 151 is denoted by Wckc and configured to transmit a Wckc clock signal.

The number of lower-layer clock bonding pads 111 is the same as the number of upper-layer clock bonding pads 101, and the number of lower-layer data bonding pads 112 is the same as the number of upper-layer data bonding pads 102. Specifically, the lower-layer clock bonding pad 111 include a first lower-layer clock bonding pad 142 and a second lower-layer clock boding pad 152. The first lower-layer clock bonding pad 142 is electrically connected with the first upper-layer clock bonding pad 141, and the second lower-layer clock bonding pad 152 is electrically connected with the second upper-layer clock bonding pad 151.

In the embodiment, the lower-layer clock bonding pad 111 and the M lower-layer data bonding pads 112 are arranged in a second row, the M lower-layer data bonding pads 112 are arranged on two sides of the lower-layer clock bonding pad 111, and half of the M lower-layer data bonding pads 112 are arranged on each side.

It is to be noted that the "first layer" does not mean that the upper-layer clock bonding pad 101 and the upper-layer data bonding pads 102 are located at a first layer in the overall structure of the transmission circuit, but only used to indicate that the upper-layer clock bonding pad 101 and the upper-layer data bonding pads 102 are arranged at the same layer in the transmission circuit. In an actual transmission circuit, the upper-layer clock bonding pad 101 and the upper-layer data bonding pads 102 may be located at any layer in the overall structure of the transmission circuit. Similarly, the "second layer" does not mean that the lower-layer clock bonding pad 111 and the lower-layer data bonding pads 112 are located at a second layer in the overall structure of the transmission circuit, but only used to indicate that the lower-layer clock bonding pad 111 and the lower-layer data bonding pads 112 are arranged at a same layer in the transmission circuit and located at a different layer from the upper-layer clock bonding pad 101 and the upper-layer data bonding pads 102. In an actual transmission circuit, the lower-layer clock bonding pad 111 and the lower-layer data bonding pads 112 may be located at any layer in the overall structure of the transmission circuit, and other functional layers may also be arranged between the first layer and the second layer.

It is to be understood that similar expressions above are also satisfied with respect to the "first row" and the "second row".

A distance between each lower-layer data bonding pad 112 and the lower-layer clock bonding pad 111 is a first distance, and a distance between an upper-layer data bonding pad 102 corresponding to the lower-layer data bonding pad 112 and the upper-layer clock bonding pad 101 is a second distance. Since the area of the lower-layer data bonding pad 112 is smaller than the area of the upper-layer data bonding pad 102 and the area of the lower-layer clock bonding pad 111 is smaller than the area of the upper-layer clock bonding pad 101, the first distance is smaller than the second distance, i.e., compared with the upper-layer data bonding pad 102 and the upper-layer clock bonding pad 101, the lower-layer data bonding pad 112 is closer to the lower-layer clock bonding pad 111.

Compared with the scheme shown in FIG. 1, when the transmission circuit in the embodiment is applied to the memory, the input buffer circuits corresponding to the lower-layer data bonding pads 112 are arranged, and a clock path of the input buffer circuit farthest from the lower-layer clock bonding pad 111 is reduced, so that the clock signal may be transmitted to the input buffer circuit furthest away from the lower-layer clock bonding pad 111 more quickly. Therefore, signal delay time caused by arrival of the data signal but non-arrival of the clock signal is reduced. Correspondingly, clock paths of each input buffer circuit are reduced, so that the signal delay time of all the input buffer circuits may be correspondingly reduced. That is, in the embodiment, tDQS2DQ or tWCK2DQ may be reduced, timing violations may be reduced, and power consumed on the clock path may be reduced.

In addition, compared with a difference between the data path between each upper-layer clock bonding pad 101 and the corresponding input buffer circuit and the clock path between each upper-layer data bonding pad 102 and the corresponding input buffer circuit, a difference between the data path between each lower-layer clock bonding pad 111 and the corresponding input buffer circuit and the clock path between each lower-layer data bonding pad 112 and the corresponding input buffer circuit is reduced, so that tDQS2DQ or tWCK2DQ of different input buffer circuits may be shortened in the embodiment, thereby improving a matching degree of the clock path and data path of different input buffer circuits, and improving the timing characteristic of data signal transmission of different input buffer circuits.

In the embodiment, the area of the lower-layer data bonding pad 112 is the same as the area of the lower-layer clock bonding pad 111. In the other embodiments, the area of the lower-layer data bonding pad may also be greater than or smaller than the area of the lower-layer clock bonding pad.

The transmission circuit further includes a first metal connecting line 104 and a second metal connecting line 105. The first metal connecting line 104 is located between the lower-layer clock bonding pad 111 and the upper-layer clock bonding pad 101. The second metal connecting line 105 is located between the lower-layer data bonding pad 112 and an upper-layer data bonding pad 102 corresponding to the lower-layer data bonding pad 112. A length of the first metal connecting line 104 is smaller than that of the second metal connecting line 105.

Since the length of the first metal connecting line 104 is smaller than that of the second metal connecting line 105, it is beneficial to centralize layout of the lower-layer clock bonding pads 111.

In the embodiment, the electrical connection between the lower-layer clock bonding pad 111 and the upper-layer clock bonding pad 101 and the electrical connection between the lower-layer data bonding pad 112 and the upper-layer data bonding pad 102 are achieved in an on die Re-Distribution Layer (RDL) manner, i.e., by a rewiring layer on the chip.

FIG. 3 is a structural schematic diagram of a cross-sectional view of an on die RDL, as shown in FIG. 3, which includes a first functional layer 1101, a second functional layer 1102, a first bonding pad 1103, a second bonding pad 1104, a first conductive plug 1113, a second conductive plug 1114, a first rewiring layer 1123, a second rewiring layer 1124, a first rewiring bonding pad 1133 and a second rewiring bonding pad 1134. The first functional layer 1101 and the second functional layer 1102 are stacked in sequence. The first bonding pad 1103 and the second bonding pad 1104 are located in the first functional layer 1101. The first conductive plug 1113 is penetrated through the second functional layer 1102 and electrically connected with the first bonding pad 1103, and the second conductive plug 1114 is penetrated through the second functional layer 1102 and electrically connected with the second bonding pad 1104. The first rewiring layer 1123 is located on a surface of the second functional layer 1102 and electrically connected with the first conductive plug 1113, and the second rewiring layer 1124 is located on the surface of the second functional layer 1102 and electrically connected with the second conductive plug 1114. The first rewiring bonding pad 1133 is located on the surface of the second functional layer 1102 and electrically connected to the first rewiring layer 1123, and the second rewiring bonding pad 1134 is located on the surface of the second functional layer 1102 and electrically connected to the second rewiring layer 1124. Through the position arrangement of the first conductive plug 1113 and the first rewiring layer 1123, the relative position and size relationship between the first rewiring bonding pad 1133 and the first bonding pad 1103 are reasonably adjusted, and the relative position and size relationship between the second rewiring bonding pad 1134 and the second bonding pad 1104 are also adjusted, so that a size of the first rewiring bonding pad 1133 is greater than that of the first bonding pad 1103, a size of the second rewiring bonding pad 1134 is greater than that of the second bonding pad 1104, and the distance between the first rewiring bonding pad 1133 and the second rewiring bonding pad 1134 is greater than the distance between the first bonding pad 1103 and the second bonding pad 1104. The first rewiring layer 1123 is much thicker than a metal layer where the first bonding pad 1103 is located, for example, the thickness of the first rewiring layer 1123 is 4 um, and the thickness of the metal layer where the first bonding pad 1103 is located is 400 nm.

Specifically, in the embodiment, the first bonding pad 1103 and the second bonding pad 1104 may be the lower-layer data bonding pad or the lower-layer clock bonding pad, and the first rewiring bonding pad 1133 and the second rewiring bonding pad 1134 may be the upper-layer data bonding pad or the upper-layer clock bonding pad. FIG. 4 is a structural schematic diagram of a partial cross-sectional view of a transmission circuit according to an embodiment of the present disclosure.

As shown in FIG. 4, in one example, the lower-layer clock bonding pad 111 and lower-layer data bonding pads 112 are located within a substrate layer 100, and a dielectric layer 103 is stacked on the substrate layer 100. The first metal connecting line 104 includes a first conductive hole 114, and the first conductive hole 114 is penetrated through the dielectric layer 103 and contacted with the lower-layer clock bonding pad 111 and the upper-layer clock bonding pad 101. The second metal connecting line 105 includes a second conductive hole 115 and a second metal layer 125. The second conductive hole 115 is penetrated through the dielectric layer 103 and contacted with the lower-layer data bonding pad 112, and the second metal layer 125 is located on one side, far away from the first layer, of the dielectric layer 103 and contacted with the second conductive hole 115 and the upper-layer data bonding pad 102.

The first metal connecting line 104 may further include a first metal layer, and the first metal layer is located on the surface, away from the substrate layer 100, of the dielectric layer 103 and contacted with the first conductive hole 114 and the upper-layer clock bonding pad 101.

A length of the first conductive hole 114 is the same as that of the second conductive hole 115, and a length of the first metal layer is smaller than that of the second metal layer 125. A cross-sectional shape of the first conductive hole 114 may be linear, a cross-sectional shape of the second conductive hole 115 may be linear, and the lengths of the first conductive hole 114 and the second conductive hole 115 are the same as a thickness of the dielectric layer 103.

In another example, the first metal connecting line 104 may include a first conductive plug, and the first conductive plug is penetrated through the dielectric layer 103 and contacted with the lower-layer clock bonding pad 111 and the upper-layer clock bonding pad 101. The second metal connecting line 105 includes a second conductive plug, and the second conductive plug is penetrated through the dielectric layer 103 and contacted with the lower-layer data bonding pad 112 and the upper-layer data bonding pad 102. A length of the first conductive plug is smaller than that of the second conductive plug.

Specifically, a cross-sectional shape of the first conductive plug may be of a linear structure, a cross-sectional shape of the second conductive plug may be of a broken line structure. The length of the first conductive plug may be the same as the thickness of the dielectric layer, and the length of the second conductive plug may be greater than the thickness of the dielectric layer.

In the embodiment, referring to FIG. 2, the transmission circuit may further include multiple lower-layer test bonding pads 106, and the multiple lower-layer test bonding pads 106 have the same area. An area of a lower-layer test bonding pad 106 is greater than that of the lower-layer data bonding pad 112. Specifically, the lower-layer test bonding pads 106, the lower-layer data bonding pads 112 and the lower-layer clock bonding pad 111 are arranged on the same layer and may be used as a test bonding pad for probe testing, a probe needs to be in contact with the lower-layer test boding pad 106 in the testing process, and the lower-layer test bonding pad 106 need to have a relatively large area in order to reduce the testing difficulty. For example, the area of the lower-layer testing bonding pad 106 is 60 μm*60 μm, and the area of the lower-layer data bonding pad 112 is 40 μm*40 μm.

According to the transmission circuit of the embodiment, the lower-layer clock bonding pad electrically connected with the upper-layer clock bonding pad and the lower-layer data bonding pads electrically connected with the upper-layer data bonding pads are arranged in an on die RDL manner, the area of the lower-layer clock bonding pad is smaller than that of the upper-layer clock bonding pad, and the area of the lower-layer data bonding pad is smaller than that of the upper-layer data bonding pad. After the input buffer circuits corresponding to the lower-layer data bonding pads are arranged, a length of the clock path required for transmitting the clock signal to each input buffer circuit is favorably shortened, the matching degree of the clock path and the data path is improved, so that tDQS2DQ or tWCK2DQ and timing violation are reduced. A length difference of the clock path corresponding to the input buffer circuit is small, and the requirement for high matching degree of the clock paths and the data path of the input buffer circuit may be met at the same time.

Correspondingly, the embodiment of the present disclosure further provides an interface circuit, which includes the transmission circuit in the above embodiment and further includes M input buffer circuits. The interface circuit according to the embodiment will be described in detail below with reference to the drawings.

Figure 5:
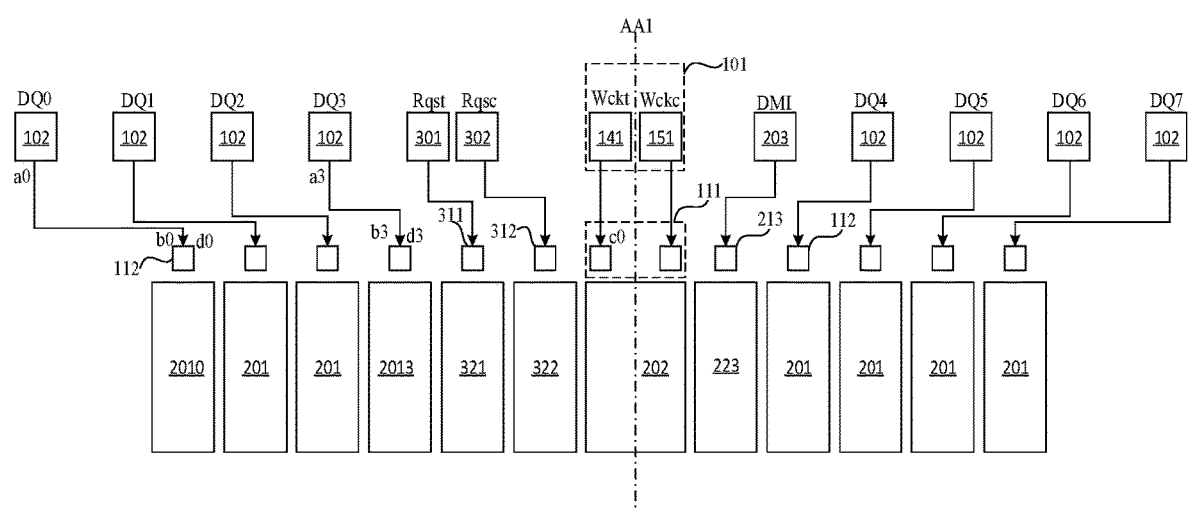
FIG. 5 is a structural schematic diagram of an interface circuit including the transmission circuit shown in FIG. 2.

FIG. 5 is a structural schematic diagram of an interface circuit according to an embodiment of the present disclosure.

Referring to FIG. 5, in the embodiment, the interface circuit includes an upper-layer clock bonding pad 101, M upper-layer data bonding pads 102, a lower-layer clock bonding pad 111, M lower-layer data bonding pads 112 and M input buffer circuits 201. The upper-layer clock bonding pad 101 is configured to transmit the clock signal. The M upper-layer data bonding pads 102 are configured to transmit the data signals. The lower-layer clock bonding pad 111 is electrically connected with the upper-layer clock bonding pad 101, and the area of the lower-layer clock bonding pad 111 is smaller than that of the upper-layer clock bonding pad 101. The M lower-layer data bonding pads 112 are electrically connected with the M upper-layer data bonding pads 102 in a one-to-one correspondence mode, the area of the lower-layer data bonding pads 112 is smaller than that of the upper-layer data bonding pad 102. The upper-layer clock bonding pad 101 and the upper-layer data bonding pads 102 are located on the first layer, the lower-layer clock bonding pad 111 and the lower-layer data bonding pads 112 are located on the second layer, the dielectric layer 103 is arranged between the first layer and the second layer, the first layer, the dielectric layer 103 and the second layer are all located on the same substrate, and M is an integer greater than or equal to 2. The M input buffer circuits 201 are in a one-to-one correspondence with the lower-layer data bonding pads 112, each input buffer circuit is configured to receive a data signal transmitted by a lower-layer data bonding pad 112 corresponding to the input buffer circuit 201 under driving of the clock signal. The lower-layer clock bonding pad 111 and the lower-layer data bonding pads 112 are arranged in a first row, the M lower-layer data bonding pads are arranged on two sides of the lower-layer clock bonding pad 111, half of the M lower-layer data bonding pads are arranged on each side. The M input buffer circuits 201 are arranged in a second row and form an axis AA1 perpendicular to the first row with the lower-layer data bonding pads 112 as references, the M input buffer circuits 201 are arranged on two sides of the axis AA1, half of the M input buffer circuits 201 are arranged on each side, and a distance between each input buffer circuit 201 and the axis is smaller than that between the lower-layer data bonding pad 112 corresponding to the input buffer circuit 201 and the axis AA1.

The interface circuit according to the embodiment will be described in detail below in combination with the drawings.

The lower-layer clock bonding pad 111 is a differential input bonding pad and includes the first lower-layer clock bonding pad 142 and the second lower-layer clock boding pad 152. The first lower-layer clock bonding pad 142 and the second lower-layer clock bonding pad 152 respectively transmit complementary clock signals. The first lower-layer clock bonding pad 142 and the second lower-layer clock bonding pad 152 are symmetrically arranged relative to the axis AA1.

In the embodiment, the first lower-layer clock bonding pad 142 and the second lower-layer clock bonding pad 152 are symmetrically arranged relative to the axis AA1. A clock path between the first lower-layer clock bonding pad 142 and an input buffer circuit 201 located on one side of the axis AA1 is a first clock path, and a clock path between the second lower-layer clock bonding pad 152 and an input buffer circuit 201 located on the other side of the axis AA1 is a second clock path, such an arrangement is beneficial to reduce a difference between the first clock path and the second clock path, thereby reducing or avoiding the adverse effects on tDQS2DQ or tWCK2DQ caused by a large difference between the first clock path and the second clock path.

It is to be noted that, in other embodiments, the first lower-layer clock bonding pad and the second lower-layer clock bonding pad may also be arranged on the same side of the axis.

Further, the "first row" and the "second row" do not mean the specific first row and second row in the overall bonding pads of the transmission circuit, but used to indicate that the bonding pads located in the first row are in a different row from the bonding pads located in the second row.

The interface circuit further includes a clock processing circuit 202, which is electrically connected with the lower-layer clock bonding pad 111 and multiple input buffer circuits 201 and configured to receive the clock signal and process the clock signal to serve as a driving clock of the M input buffer circuits 201. The clock processing circuit 202 includes a clock receiver circuit and a phase generating circuit, the clock receiver circuit is electrically connected with the lower-layer clock bonding pad 111 and configured to receive the clock signal, an output of the clock receiver circuit serves as an input of the phase generating circuit, and the phase generating circuit is configured to generate the driving clock.

The clock processing circuit 202 is coincident with the axis AA1, i.e., the clock processing circuit 202 is located at the position where the axis AA1 is located. In this way, it is advantageous to reduce a difference in clock paths required for the driving clock to be transmitted to the input buffer circuits 201 on both sides of the axis AA1. The clock processing circuit 202 is located at the position where the axis AA1 is located, which does not mean that the clock processing circuit 202 is completely symmetrical with respect to the axis AA1. Considering that the actual situation in the circuit design and manufacturing, the clock processing circuit is approximately located at the position where the axis AA1 is located, and its centerline to deviate from AA1 by a certain value is allowed, such as by 10% or 20%.

Each input buffer circuit 201 is located directly below the corresponding lower-layer data bonding pad 112. The input buffer circuit 201 receives the data signal under driving of the clock signal and continues to transmit the data signal. That is, when the data signal of the upper-layer data bonding pad 102 is transmitted to the input buffer circuit 201, the input buffer circuit 201 receives the data signal and transmits the data signal only when the clock signal has also been transmitted to the input buffer circuit 201. When the data signal is transmitted to the input buffer circuit 201 and the clock signal has not been reached, the input buffer circuit 201 does not transmit the data signal.

In the embodiment, due to the centralized layout of the lower-layer data bonding pads 112 compared to the upper-layer data bonding pad 102, a distance between each input buffer circuit 201 and the axis AA1 is smaller than that between an upper-layer data bonding pad 102 corresponding to the input buffer circuit 201 and the axis AA1, i.e., each input buffer circuit 201 is closer to the axis AA1 than the upper-layer data bonding pad 102. Specifically, taking the axis AA1 as a reference, the layout density of the M input buffer circuits 201 is greater than that of the M upper-layer data bonding pads 102. For each upper-layer data bonding pad 102 and the corresponding input buffer circuit 201, the distance between the upper-layer data bonding pad 102 and the axis AA1 is greater than that between the input buffer circuit 201 and the axis AA1. Furthermore, the closer the upper-layer data bonding pad 102 is to the axis AA1, the closer the input buffer circuit 201 corresponding to the upper-layer data pad 102 is to the axis AA1.

Specifically, a length of an input data path between each input buffer circuit 201 and the upper-layer data bonding pad 102 corresponding to the input buffer circuit 201 is a first length, a length of a clock path between each input buffer circuit 201 and the upper-layer clock bonding pad 101 is a second length, and the first length and the second length are in positive correlation. That is, for all the input buffer circuits 201, the larger the first length corresponds to the larger the second length, and the smaller the first length corresponds to the smaller the second length. That is, the farther the upper-layer data bonding pad 102 is from the axis AA1, the farther the input buffer circuit 201 corresponding to the upper-layer data bonding pad 102 is from the axis AA1; and the closer the upper-layer data bonding pad 102 is to the axis AA1, the closer the input buffer circuit 201 corresponding to the upper-layer data bonding pad 102 is to the axis AA1.

Compared with the scheme shown in FIG. 1 that the distance between each input buffer circuit and the axis is equal to the distance between the corresponding data bonding pad and the axis, in the embodiment, for each upper-layer data bonding pad 102 and each input buffer circuit 201 on the same side of the axis AA1, the clock path of the input buffer circuit 201 farthest from the upper-layer clock bonding pad 101 is reduced, therefore, the clock signal may be transmitted to the input buffer circuit 201 farthest from the upper-layer clock bonding pad 101 more quickly, so that the signal delay time caused by arrival of the data signal but non-arrival of the clock signal is reduced. Correspondingly, the clock path of each input buffer circuit 201 is reduced, so that the signal delay time of all the input buffer circuits 201 may be correspondingly reduced. That is, in the embodiment, tDQS2DQ or tWCK2DQ may be reduced, timing violation may be reduced, and power consumed on the clock path may be reduced.

In addition, the difference between the data path between each lower-layer clock bonding pad 102 and the corresponding input buffer circuit 201 and the clock path between each upper-layer clock bonding pad 101 and the corresponding input buffer circuit 201 is reduced, so that in the embodiment, tDQS2DQ or tWCK2DQ of different input buffer circuits 201 may be shortened, thereby improving the matching degree of clock paths and data paths of different input buffer circuits, and improving the timing characteristic of data signal transmission of different input buffer circuits 201.

For example, the data signal of the upper-layer data bonding pad 102 labeled DQ0 in FIG. 5 is transmitted to the corresponding input buffer circuit 201 via a first length transmission path, the corresponding input buffer circuit is denoted by 2010 in FIG. 5, and the clock signal is transmitted to the corresponding input buffer circuit 201 via a second length transmission path. For DQ0, the first length refers to the length from point a0 to point b0, the second length refers to the length from point c0 to point d0, point a0 may be understood as a connection point of a transmission line to the upper-layer data bonding pad 102, point b0 may be understood as a connection point of the transmission line to the lower-layer data bonding pad 112, point c0 may be understood as a connection point of the transmission line to the clock processing circuit 202, d0 may be understood as a connection point of the transmission line to the lower-layer data bonding pad 112, and d0 and b0 may be the same connection point. When the data signal is transmitted to the input buffer circuit 201, the clock signal is transmitted to the input buffer circuit 201 after the time of t1, thereby ensuring that after receiving the data signal, the input buffer circuit 201 may transmit the data signals out after the waiting time of t1. As a rate where the data bonding pad 201 transmit the data signal DQ0 is getting higher and higher, a time for DQ0 to maintain a high level "1" or a low level "0" is getting shorter and shorter, thereby requiring the waiting time t1 to be smaller and smaller and the first length (corresponding to the data path) to match the second length (corresponding to the clock path) as much as possible.

For example, the data signal of the upper-layer data bonding pad 102 labeled DQ3 in FIG. 5 is transmitted to the corresponding input buffer circuit 201 via the first length transmission path, the corresponding input buffer circuit is denoted by 2013 in FIG. 5, and the clock signal is transmitted to the corresponding input buffer circuit 201 via the second length transmission path. For DQ3, the first length refers to a length from point a3 to point b3, the second length refers to a length from point c0 to point d3, and b3 and d3 may be the same point. When the data signal is transmitted to the input buffer circuit 201, the clock signal is transmitted to the input buffer circuit 201 after the time of t2, thereby ensuring that after receiving the data signal, the input buffer circuit 201 may transmit the data signals out after the waiting time of t2. For the upper-layer data bonding pads 102 labeled DQ0 and labeled DQ3, t1 and t2 are equal or approximately equal because the first length and the second length of the input buffer circuit 201 corresponding to DQ0 are matched, and the first length and the second length of the input buffer circuit 201 corresponding to DQ3 are also matched. Therefore, in the embodiment, it is possible to improve the time consistency of the data signal transmitted by different input buffer circuits 201, i.e., better timing characteristic.

In addition, a length of the input data path between each input buffer circuit 201 and the lower-layer data bonding pad 112 corresponding to the input buffer circuit 201 is a third length, a length of the clock path between each input buffer circuit 201 and the lower-layer clock bonding pad 111 corresponding to the input buffer circuit 201 is a fourth length, and the third length and the fourth length are in positive correlation.

In addition, the interface circuit may further include an upper-layer mark bonding pad 203, a lower-layer mark bonding pad 213 and a mark buffer circuit 223. The upper-layer mark bonding pad 203 is configured to transmit a mark signal and located on the first layer. The lower-layer mark bonding pad 213 is electrically connected with the upper-layer mark bonding pad 203 and located on the second layer, and the area of the lower-layer mark bonding pad 213 is smaller than that of the upper-layer mark bonding pad 203. The mark buffer circuit 223 corresponds to the upper-layer mark bonding pad 203 and is configured to receive the mark signal transmitted by the upper-layer mark bonding pad 203 under driving of the clock signal.

The mark signal is generally referred to as a data mask inverter to indicate whether each data signal is inverted or not, and the upper-layer mark bonding pad 203 is generally referred to as a data mask inverter (DMI) bonding pad, a DM bonding pad or a DBI bonding pad, and the upper-layer mark bonding pad 203 is labeled with DMI in FIG. 5.

In the embodiment, the lower-layer mark bonding pad 213 is arranged in the first row and located between the lower-layer data bonding pad 112 and the lower-layer clock bonding pad 111. The mark buffer circuit 223 is arranged in the second row and located on the same side of the axis AA1 as the lower-layer mark bonding pad 213 and between the input buffer circuits 201 and the axis AA1. A distance between the mark buffer circuit 223 and the axis AA1 is smaller than that between the lower-layer mark bonding pad 213 corresponding to the mark buffer circuit 223 and the axis AA1.

The interface circuit may further include M output buffer circuits, which are in a one-to-one correspondence with the lower-layer data bonding pads 112, each output buffer circuit is configured to transmit the data signal to the corresponding lower-layer data bonding pad 112 under driving of the clock signal. The output buffer circuit is electrically connected with the lower-layer clock bonding pad 111 in addition to being electrically connected with the lower-layer data bonding pad 112.

Specifically, the output buffer circuit is electrically connected with the lower-layer clock bonding pad 111 via the clock receiver circuit and the phase generating circuit.

In the embodiment, a length of an output data path between each output buffer circuit to a lower-layer data bonding pad 112 corresponding to the output buffer circuit is the same. Specifically, each output buffer circuit is located directly below the corresponding lower-layer data bonding pad 111, or, a distance between each output buffer circuit and the axis AA1 is equal to a distance between the corresponding lower-layer data bonding pad and the axis AA1. Similarly, considering that the actual situation in the circuit design and manufacture, the same length e or equal distance may also be approximately the same or approximately equal, allowing for certain errors, and similar descriptions will not be repeated later.

In the embodiment, the output buffer circuits may be integrated with the input buffer circuits 201 in one functional module.

The interface circuit may further include multiple power supply bonding pads and grounding bonding pads, which are configured to connect to ground or a fixed power supply. The multiple power supply bonding pads and the grounding bonding pads are located in a same row with the upper-layer data bonding pads 102.

The interface circuit may further include a first upper-layer functional bonding pad 301, a second upper-layer functional bonding pad 302, a first lower-layer functional bonding pad 311 and a second lower-layer functional bonding pad 312. The first upper-layer functional bonding pad 301 and the second upper-layer functional bonding pad 302 are located on the first layer and between the upper-layer data bonding pad 102 and the upper-layer clock bonding pad 101, the first upper-layer functional bonding pad 301 is configured to transmit a Rqst signal and the second upper-layer functional bonding pad 302 is configured to transmit a Rqsc signal. The first lower-layer functional bonding pad 311 and the second lower-layer functional bonding pad 312 are located on the second layer, the first lower-layer functional bonding pad 311 is electrically connected with the first upper-layer functional bonding pad 301, the second lower-layer functional bonding pad 312 is electrically connected with the second upper-layer functional bonding pad 302, an area of the first lower-layer functional bonding pad 311 is smaller than that of the first upper-layer functional bonding pad 301, and an area of the second lower-layer functional bonding pad 312 is smaller than that of the second upper-layer functional bonding pad 302. The first upper-layer functional bonding pad 301 is denoted by Rqst and the second upper layer functional bonding pad 302 is denoted by Rqsc in FIG. 5.

The interface circuit may further include a first functional buffer circuit 321 and a second functional buffer circuit 322. The first functional buffer circuit 321 is configured to receive the mark signal transmitted by the first lower-layer functional bonding pad 311 under driving of the clock signal. The second functional buffer circuit 322 is configured to receive the Rqsc signal transmitted by the second lower-layer functional bonding pad 312 under driving of the clock signal.

The input buffer circuit includes a multiplexer (mux) and a latch, the multiplexer is configured to receive the data signal, process the data signal and output a processed data signal to the latch, and an output of the latch serves as an output of the input buffer circuit.

The interface circuit may further include M Sequential to Parallel (S2P) conversion circuits, the M S2P conversion circuits are in a one-to-one correspondence with the M input buffer circuits 201, and an output of the input buffer circuit 201 serves as an input of a corresponding S2P conversion circuit. The M S2P conversion circuits are in a one-to-one correspondence with the M lower-layer data bonding pads 112, and a distance between each S2P conversion circuit and a lower-layer data bonding pad 112 corresponding to the S2P conversion circuit is the same. It may be considered that each S2P conversion circuit is laid out directly below the corresponding lower-layer data bonding pad 112.

The interface circuit may further include M Output First Input First Output (Output FIFO) circuits, M Parallel to Sequential (P2S) conversion circuits and M driving circuits. The M Output FIFO circuits are in a one-to-one correspondence with the M S2P conversion circuits. The M P2S conversion circuits are in a one-to-one correspondence with the M Output FIFO circuits, and an output of each Output FIFO circuit serves as an input of a P2S conversion circuit corresponding to the Output FIFO circuit. The M driving circuits are in a one-to-one correspondence with the M P2S conversion circuits, and an output of each P2S conversion circuit serves as an input of a driving circuit corresponding to the P2S conversion circuit; and the M driving circuits are in a one-to-one correspondence with the M lower-layer data bonding pads 112.

Figure 6:
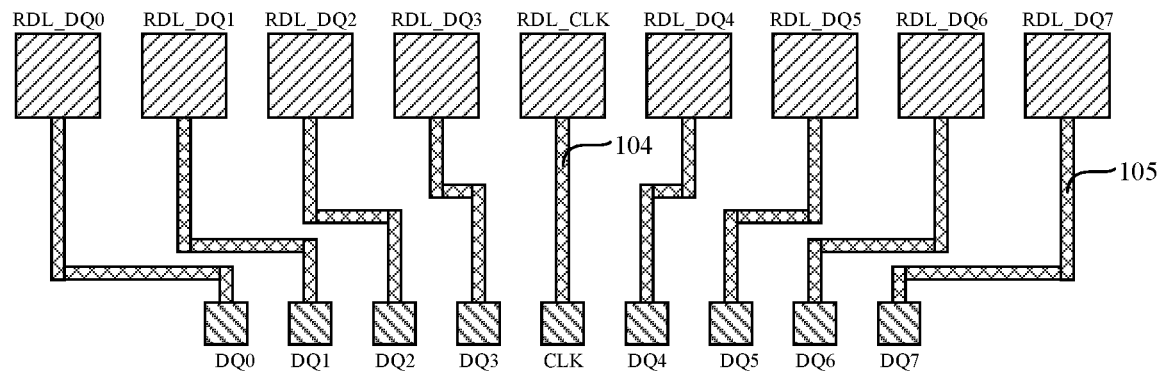
FIG. 6 is a layout schematic diagram of an interface circuit according to an embodiment of the present disclosure shown in FIG. 5.
Figure 7:
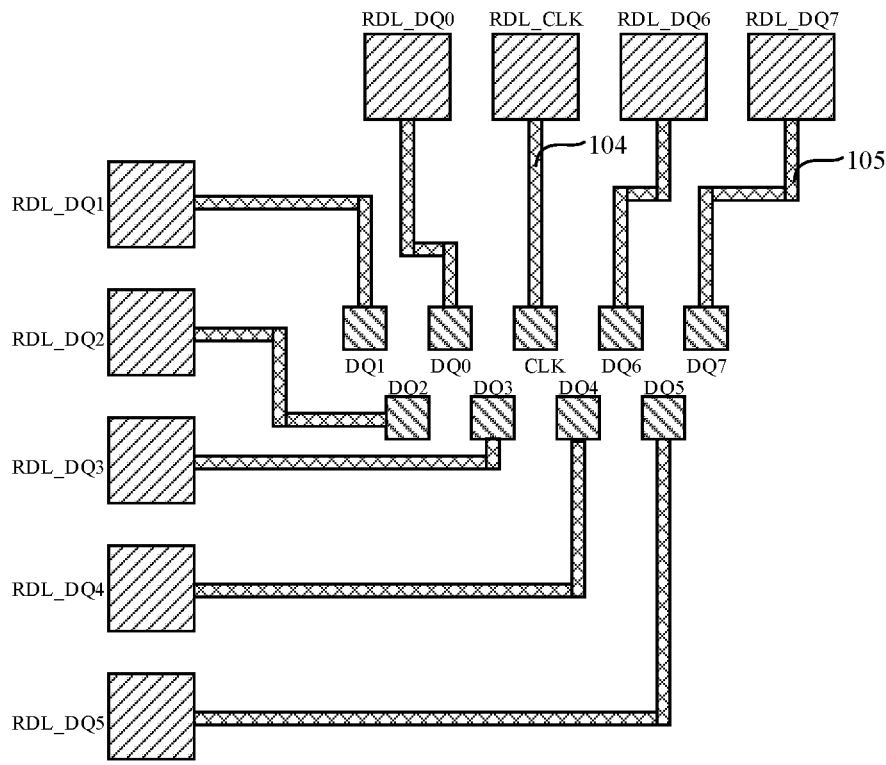
FIG. 7 is another layout schematic diagram of an interface circuit according to an embodiment of the present disclosure shown in FIG. 5.

FIG. 6 is a layout schematic diagram of an interface circuit according to an embodiment of the present disclosure. FIG. 7 is another layout schematic diagram of an interface circuit according to an embodiment of the disclosure. In FIG. 6 and FIG. 7, the lower-layer data bonding pads are denoted by DQ0, DQ1, DQ2, DQ3, DQ4, DQ5, DQ6, DQ7, the corresponding upper-layer data bonding pads are denoted by RDL_DQ0, RDL_DQ1, RDL_DQ2, RDL_DQ3, RDL_DQ4, RDL_DQ5, RDL_DQ6, RDL_DQ7, the lower-layer clock bonding pad is denoted by CLK, and the corresponding upper-layer clock bonding pad is denoted by RDL_CLK.

As shown in FIG. 6, in one example, the upper-layer data bonding pads and the upper-layer clock bonding pad are both arranged in the same row, and the lower-layer data bonding pads and the lower-layer clock bonding pads are both arranged in the same row. As shown in FIG. 7, in another example, part of the upper-layer data bonding pads and the upper-layer clock bonding pads are arranged in the same row, the remaining are arranged in the same column, and the lower-layer data bonding pads and the lower-layer clock bonding pad are arranged in two rows. It can be understood that the lower-layer data bonding pads and the lower-layer clock boding pad may also be arranged in the same row, or, the upper-layer clock boding pad and the upper-layer data bonding pads are arranged around three sides or four sides of the lower-layer clock bonding pad and the lower-layer data bonding pads. It can be understood that the situation shown in FIG. 7 is that the upper-layer clock bonding pad and the upper-layer data bonding pads are arranged around two sides of the lower-layer clock bonding pad and the lower-layer data bonding pads.

In the interface circuit according to the embodiment, the lower-layer clock bonding pad electrically connected with the upper-layer clock bonding pad and the lower-layer data bonding pads electrically connected with the upper-layer data bonding pads are arranged in an on die RDL manner, the area of the lower-layer clock bonding pad is smaller than that of the upper-layer clock bonding pad, the area of the lower-layer data bonding pad is smaller than that of the upper-layer data bonding pad. Therefore, the centralized layout of each input buffer circuit is achieved, the length of the clock path required for transmitting the clock signal to each input buffer circuit is shortened, the matching degree of the clock path and the data path is improved, and tDQS2DQ or tWCK2DQ and timing violation are reduced. The length difference of the clock path corresponding to the input buffer circuit is small, and the requirement for high matching degree of the clock path and the data path of the input buffer circuit may be met at the same time.

In addition, as the length of the clock path is shortened, a length of a wire for transmitting the clock signal is correspondingly shortened, and the power consumption of the data transmission circuit may be reduced to a certain extent.

Correspondingly, according to an embodiment of the disclosure, a memory is provided, which includes the interface circuit described above.

The memory may be DRAM, SRAM, MRAM, FeRAM, PCRAM, NAND, NOR, or the like. For example, the memory may be the LPDDR4 memory or the LPDDR5 memory.

It can be understood by those of ordinary skill in the art that the implementations described above are specific embodiments for implementing the present disclosure, and in practical applications, various changes in form and detail may be made without departing from the spirit and scope of the present disclosure. Various changes and modifications without departing from the spirit and scope of the present disclosure may be made by any person skilled in the art, and therefore the scope of the present disclosure shall be subject to the scope of the claims.

What is claimed is:

1. A transmission circuit, comprising:
an upper-layer clock bonding pad, configured to transmit a clock signal;
M upper-layer data bonding pads, configured to transmit data signals;
a lower-layer clock bonding pad, electrically connected with the upper-layer clock bonding pad, wherein an area of the lower-layer clock bonding pad is smaller than that of the upper-layer clock bonding pad; and
M lower-layer data bonding pads, electrically connected with the M upper-layer data bonding pads in a one-to-one correspondence, wherein an area of a lower-layer data bonding pad is smaller than that of an upper-layer data bonding pad;

wherein the upper-layer clock bonding pad and the upper-layer data bonding pads are located on a first layer, the lower-layer clock bonding pad and the lower-layer data bonding pads are located on a second layer, a dielectric layer is arranged between the first layer and the second layer, and the first layer, the dielectric layer and the second layer are all located on a same substrate, M being an integer greater than or equal to 2;

wherein the lower-layer data bonding pads are arranged in two parallel rows, and the lower-layer clock bonding pad is located in one of the two parallel rows; and wherein part of the upper-layer data bonding pads and the upper-layer clock bonding pad are arranged in a same row, and remaining upper-layer data bonding pads are arranged in a same column around two or more sides of the two parallel rows of the lower-layer data bonding pads and the lower-layer clock bonding pad.

2. The transmission circuit of claim 1, further comprising: a first metal connecting line, located between the lower-layer clock bonding pad and the upper-layer clock bonding pad; and a second metal connecting line, located between a lower-layer data bonding pad and an upper-layer data bonding pad corresponding to the lower-layer data bonding pad, wherein a length of the first metal connecting line is smaller than that of the second metal connecting line.

3. The transmission circuit of claim 2, wherein the first metal connecting line comprises: a first conductive hole, penetrated through the dielectric layer and contacted with the lower-layer clock bonding pad; and a first metal layer, located on one side of the dielectric layer away from the first layer and contacted with the first conductive hole and the upper-layer clock bonding pad; and the second metal connecting line comprises: a second conductive hole, penetrated through the dielectric layer and contacted with the lower-layer data bonding pad; and a second metal layer, located on one side of the dielectric layer away from the first layer and contacted with the second conductive hole and the upper-layer data bonding pad;

wherein a length of the first conductive hole is the same as that of the second conductive hole, and a length of the first metal layer is smaller than that of the second metal layer.

4. The transmission circuit of claim 2, wherein the first metal connecting line comprises a first conductive plug, penetrated through the dielectric layer and contacted with the lower-layer clock bonding pad and the upper-layer clock bonding pad; and the second metal connecting line comprises a second conductive plug, penetrated through the dielectric layer and contacted with the lower-layer data bonding pad and the upper-layer data bonding pad;

wherein a length of the first conductive plug is smaller than that of the second conductive plug.

5. The transmission circuit of claim 1, wherein the area of the lower-layer clock bonding pad is the same as that of the lower-layer data bonding pad.

6. The transmission circuit of claim 1, further comprising a plurality of lower-layer test bonding pads, wherein the plurality of lower-layer test bonding pads have a same area, and an area of a lower-layer test bonding pad is greater than that of the lower-layer data bonding pad.

7. A memory, comprising the transmission circuit according to claim 1.

* * * * *